United States Patent
Tian

(10) Patent No.: US 12,277,992 B2
(45) Date of Patent: Apr. 15, 2025

(54) MEMORY DEVICE AND ZQ CALIBRATION METHOD

(71) Applicant: CHANGXIN MEMORY TECHNOLOGIES, INC., Hefei (CN)

(72) Inventor: Kai Tian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 97 days.

(21) Appl. No.: 18/364,490

(22) Filed: Aug. 3, 2023

(65) Prior Publication Data

US 2023/0420008 A1 Dec. 28, 2023

Related U.S. Application Data

(63) Continuation of application No. PCT/CN2022/123909, filed on Oct. 8, 2022.

(30) Foreign Application Priority Data

Jun. 22, 2022 (CN) .......................... 202210716321.6

(51) Int. Cl.
*G11C 7/10* (2006.01)
(52) U.S. Cl.
CPC .......... *G11C 7/1048* (2013.01); *G11C 7/1078* (2013.01); *G11C 7/1084* (2013.01); *G11C 2207/2254* (2013.01)
(58) Field of Classification Search
CPC ... G11C 7/1048; G11C 7/1078; G11C 7/1084; G11C 2207/2254
See application file for complete search history.

(56) References Cited

U.S. PATENT DOCUMENTS

| | | | | |
|---|---|---|---|---|
| 7,746,719 B2* | 6/2010 | Kang | ....................... | G11C 7/20 |
| | | | | 365/225.7 |
| 9,767,921 B1* | 9/2017 | Pan | ......................... | G11C 8/06 |
| 9,871,518 B2* | 1/2018 | Chen | ................... | G11C 11/4074 |
| 10,193,711 B2* | 1/2019 | Wieduwilt | ............. | G11C 16/32 |

(Continued)

FOREIGN PATENT DOCUMENTS

| | | |
|---|---|---|
| CN | 108133724 A | 6/2018 |
| CN | 111009279 A | 4/2020 |
| CN | 111863065 A | 10/2020 |

OTHER PUBLICATIONS

International Search Report cited in PCT/CN2022/123909 mailed Jan. 28, 2023, 10 pages.

*Primary Examiner* — Son L Mai
(74) *Attorney, Agent, or Firm* — Syncoda LLC; Feng Ma

(57) ABSTRACT

The present disclosure provides a memory device and a ZQ calibration method. The memory device includes: two calibration resistor interfaces connected to a same ZQ calibration resistor; a first master chip, a plurality of first slave chips cascaded together, a second master chip, and a plurality of second slave chips cascaded together that are all connected to the ZQ calibration resistor, where first transmission terminals and second transmission terminals are configured to transmit a ZQ flag signal; and an identification module configured to identify a priority calibration chip and a delay calibration chip, and identify the slave chip cascaded with the priority calibration chip as a primary slave chip and the slave chip cascaded with the delay calibration chip as a secondary slave chip.

17 Claims, 11 Drawing Sheets

(56) References Cited

U.S. PATENT DOCUMENTS

| | | | |
|---|---|---|---|
| 10,276,220 B2* | 4/2019 | Jeon | G11C 7/1057 |
| 10,896,704 B2 | 1/2021 | Johnson et al. | |
| 11,475,955 B2* | 10/2022 | Lee | G11C 16/06 |
| 2014/0167281 A1 | 6/2014 | Byeon | |
| 2021/0065753 A1 | 3/2021 | Lee et al. | |

* cited by examiner

MEMORY DEVICE AND ZQ CALIBRATION METHOD

CROSS-REFERENCE TO RELATED APPLICATIONS

This is a continuation of International Patent Application No. PCT/CN2022/123909, filed on Oct. 8, 2022, which claims the priority to Chinese Patent Application No. 202210716321.6, titled "MEMORY DEVICE AND ZQ CALIBRATION METHOD" and filed on Jun. 22, 2022. The disclosures of International Patent Application No. PCT/CN2022/123909 and Chinese Patent Application No. 202210716321.6 are incorporated herein by reference in their entireties.

TECHNICAL FIELD

The present disclosure relates to, but is not limited to, a memory device and a ZQ calibration method.

BACKGROUND

ZQ calibration plays an important role in a dynamic random access memory (DRAM). Specifically, the ZQ calibration determines whether the output impedance of an output port is accurate, and whether the termination resistance of an input port is accurate. The offset of the output impedance and termination resistance may cause severe distortion of a signal due to impedance mismatch during transmission, and a higher signal frequency further leads to a greater influence of the distortion on the signal.

The number of ZQ calibration resistors required by low power double data rate 5 (LPDDR5) has been specified in the package definition of joint electron device engineering council (JEDEC). For example, there is one ZQ calibration resistor for DIS315 chips, and two ZQ calibration resistors for POP496 chips. Hence, the number of the ZQ calibration resistors in the LPDDR5 is significantly less than the number of the ZQ calibration resistors in LPDDR4.

With the increasing requirements for a larger LPDDR capacity, more and more chips need to be placed in one LPDDR package. However, each chip requires individual ZQ calibration due to its unique presence. Especially for an LPDDR5 package, the number of the ZQ calibration resistors is significantly less than that in the LPDDR4, and more chips are required to share one ZQ calibration resistor. How to allow a plurality of chips to share the same ZQ calibration resistor for ZQ calibration is currently an urgent technical problem to be solved.

SUMMARY

An overview of the subject described in detail in the present disclosure is provided below, which is not intended to limit the protection scope of the claims.

The present disclosure provides a memory device and a ZQ calibration method.

A first aspect of the present disclosure provides a memory device, including: two calibration resistor interfaces, connected to a same ZQ calibration resistor; and a first master chip, a plurality of first slave chips cascaded together, a second master chip, and a plurality of second slave chips cascaded together that are all connected to the ZQ calibration resistor, wherein the first master chip, the first slave chips, the second master chip, and the second slave chips are each provided with a first transmission terminal and a second transmission terminal, and each of the first transmission terminal and the second transmission terminal are configured to transmit a ZQ flag signal; the second transmission terminal of the first master chip is connected to the first transmission terminal of a first slave chip of a first stage in the plurality of first slave chips, the second transmission terminal of a first slave chip of each stage is connected to the first transmission terminal of a first slave chip of a next stage, the second transmission terminal of the second master chip is connected to the first transmission terminal of a second slave chip of a first stage in the plurality of second slave chips, and the second transmission terminal of a second slave chip of each stage is connected to the first transmission terminal of a second slave chip of a next stage; and a first signal receiver is provided in each of the first master chip and the second master chip, and a second signal receiver is provided in each of the plurality of first slave chips and the plurality of second slave chips; and an identification module, configured to identify one of the first master chip and the second master chip as a priority calibration chip and the other one as a delay calibration chip, and the first slave chip or the second slave chip cascaded with the priority calibration chip as a primary slave chip and the first slave chip or the second slave chip cascaded with the delay calibration chip as a secondary slave chip, wherein in a command mode, the first signal receiver is configured to receive, through a ZQ signal terminal, a ZQ calibration command provided by a memory, or perform delay processing on the ZQ calibration command after the ZQ calibration command is received through the ZQ signal terminal, the priority calibration chip starts calibration based on the ZQ calibration command, the delay calibration chip starts the calibration based on the delayed ZQ calibration command, the first master chip and the second master chip send the ZQ flag signal through the second transmission terminals after completing the calibration, and the ZQ flag signal indicates that a current chip has completed calibration by using the calibration resistor; and the second signal receiver is configured to receive the ZQ flag signal through the first transmission terminal, the primary slave chip and the secondary slave chip start the calibration based on the ZQ flag signal, and a current primary slave chip and a current secondary slave chip send the ZQ flag signal through the second transmission terminals after completing the calibration, until all the first slave chips or all the second slave chips complete the calibration.

A second aspect of the present disclosure provides a ZQ calibration method, applied to the memory device according to the first aspect above, and including: identifying a priority calibration chip and a delay calibration chip in a first master chip and a second master chip, taking a first slave chip or a second slave chip cascaded with the priority calibration chip as a primary slave chip, and taking the first slave chip or the second slave chip cascaded with the delay calibration chip as a secondary slave chip; in a command mode, obtaining the ZQ calibration command applied outside the memory device; performing a first calibration on the priority calibration chip in response to the ZQ calibration command; after the first calibration is completed, transmitting the ZQ flag signal to a primary slave chip of a first stage, and performing a second calibration on the priority calibration chip; performing the first calibration on the primary slave chip of the first stage in response to the ZQ flag signal; after the first calibration on the primary slave chip of the first stage is completed, transmitting the ZQ flag signal to a primary slave chip of a next stage, and performing the second calibration on the primary slave chip of the first stage, until a primary slave chip of a last stage has completed the first calibration; completing the second calibration on the primary slave chip of the last stage; performing the first calibration on the delay calibration chip in response to the delayed ZQ calibration command; after the first calibration is completed, transmitting the ZQ flag signal to a secondary slave chip of a first stage, and performing the second calibration on the delay calibration chip; performing the first calibration on the secondary slave chip of the first stage in response to the ZQ flag signal; after the first calibration on the secondary slave chip of the first stage is completed, transmitting the ZQ flag signal to a secondary slave chip of a next stage, and performing the second calibration on the secondary slave chip of the first stage, until a secondary slave chip of a last stage has completed the first calibration; and completing the second calibration on the secondary slave chip of the last stage.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

REFERENCE NUMERALS

Figure 1:
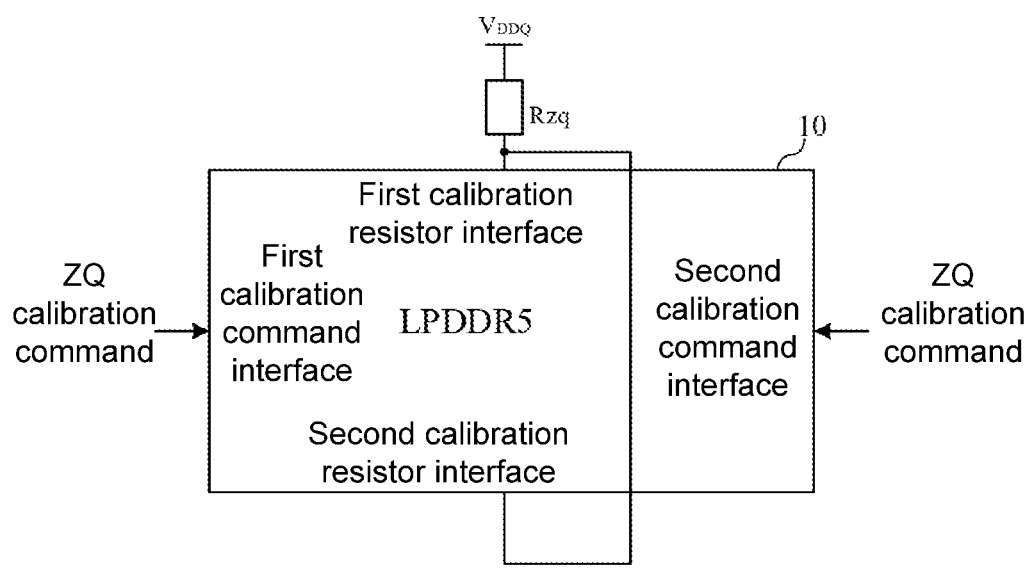
FIG. 1 is a schematic receiving diagram of two calibration resistor interfaces connected to a same ZQ calibration resistor according to an embodiment of the present disclosure.

P1: Second transmission terminal A of a primary slave chip of a third stage, First transmission terminal of a priority calibration chip P2: Second transmission terminal A of a priority calibration chip, First transmission terminal of a primary slave chip of a first stage P3: Second transmission terminal A of a primary slave chip of a first stage, First transmission terminal of a primary slave chip of a second stage P4: Second transmission terminal A of a primary slave chip of a second stage, First transmission terminal of a primary slave chip of a third stage P5: Second transmission terminal A of a secondary slave chip of a third stage, First transmission terminal of a delay calibration chip P6: Second transmission terminal A of a delay calibration chip, First transmission terminal of a secondary slave chip of a first stage P7: Second transmission terminal A of a secondary slave chip of a first stage, First transmission terminal of a secondary slave chip of a second stage P8: Second transmission terminal A of a secondary slave chip of a second stage, First transmission terminal of a secondary slave chip of a third stage P9: Second transmission terminal A of a secondary slave chip of a third stage, Fourth transmission terminal of a priority calibration chip P10: Second transmission terminal A of a slave chip of a first stage, First transmission terminal of a primary slave chip of a second stage P11: Second transmission terminal A of a slave chip of a second stage, First transmission terminal of a primary slave chip of a third stage P12: Second transmission terminal A of a primary slave chip of a third stage, Third transmission terminal of a delay calibration chip

DETAILED DESCRIPTION

The technical solutions in the embodiments of the present disclosure are described below clearly and completely referring to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

It can be known from the background that with the increasing demand for LPDDR capacity, more and more chips need to be placed in one LPDDR package. However, each chip requires individual ZQ calibration due to individual differences. Especially for an LPDDR5 package, the number of the ZQ calibration resistors is significantly less than that in the LPDDR4, and more chips are required to share one ZQ.

An embodiment of the present disclosure provides a memory device. A new control circuit is designed to realize that a plurality of chips, theoretically having no quantitative limitation, share a ZQ calibration resistor.

Figure 2:
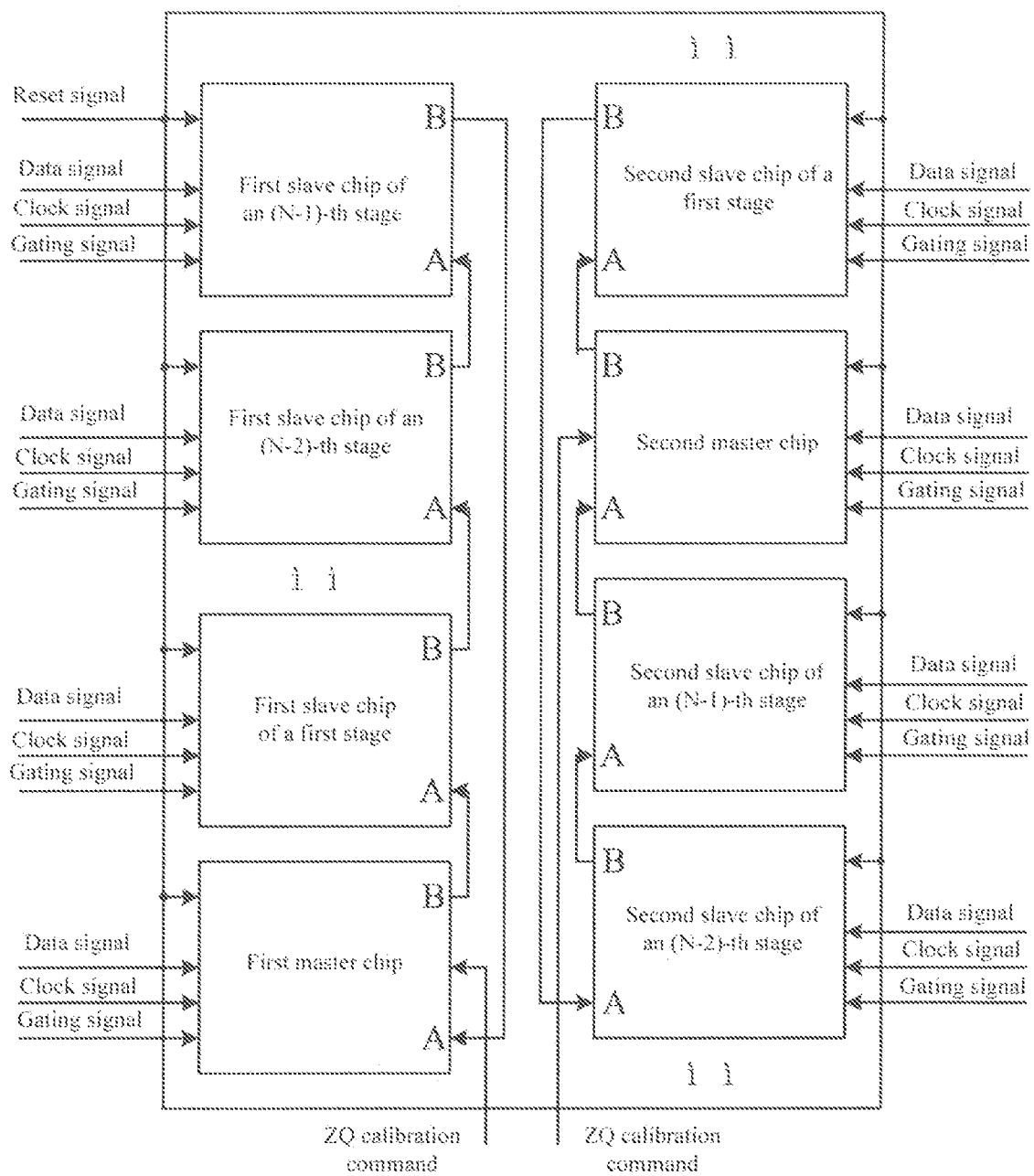
FIG. 2 to FIG. 5 are schematic structural diagrams of a memory device in various connection modes according to an embodiment of the present disclosure.
Figure 6:
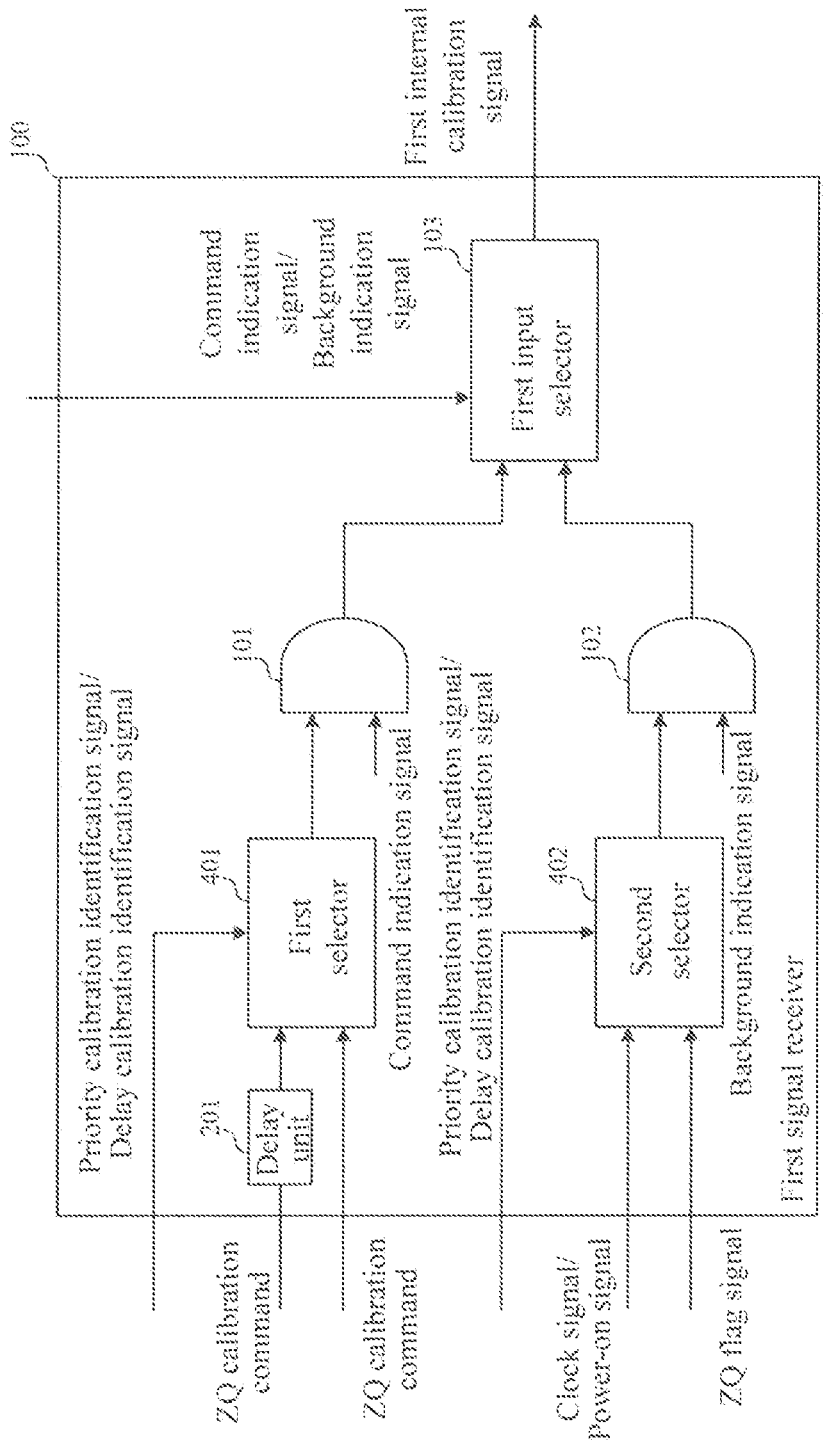
FIG. 6 is a schematic structural diagram of a first signal receiver according to an embodiment of the present disclosure.
Figure 7:
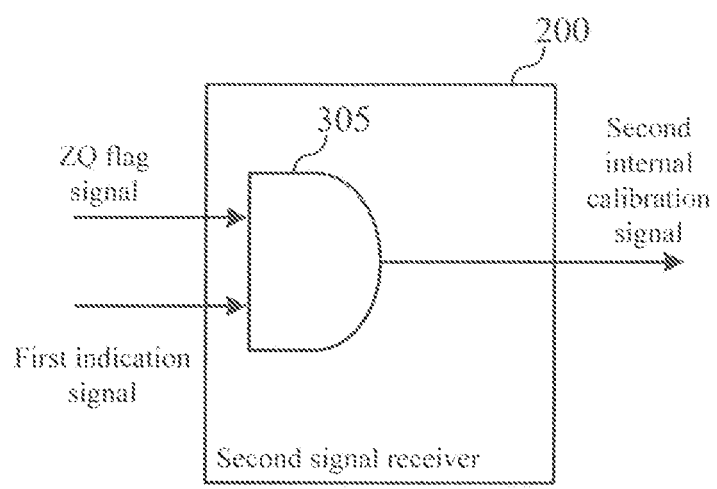
FIG. 7 is a schematic structural diagram of a second signal receiver according to an embodiment of the present disclosure.
Figure 8:
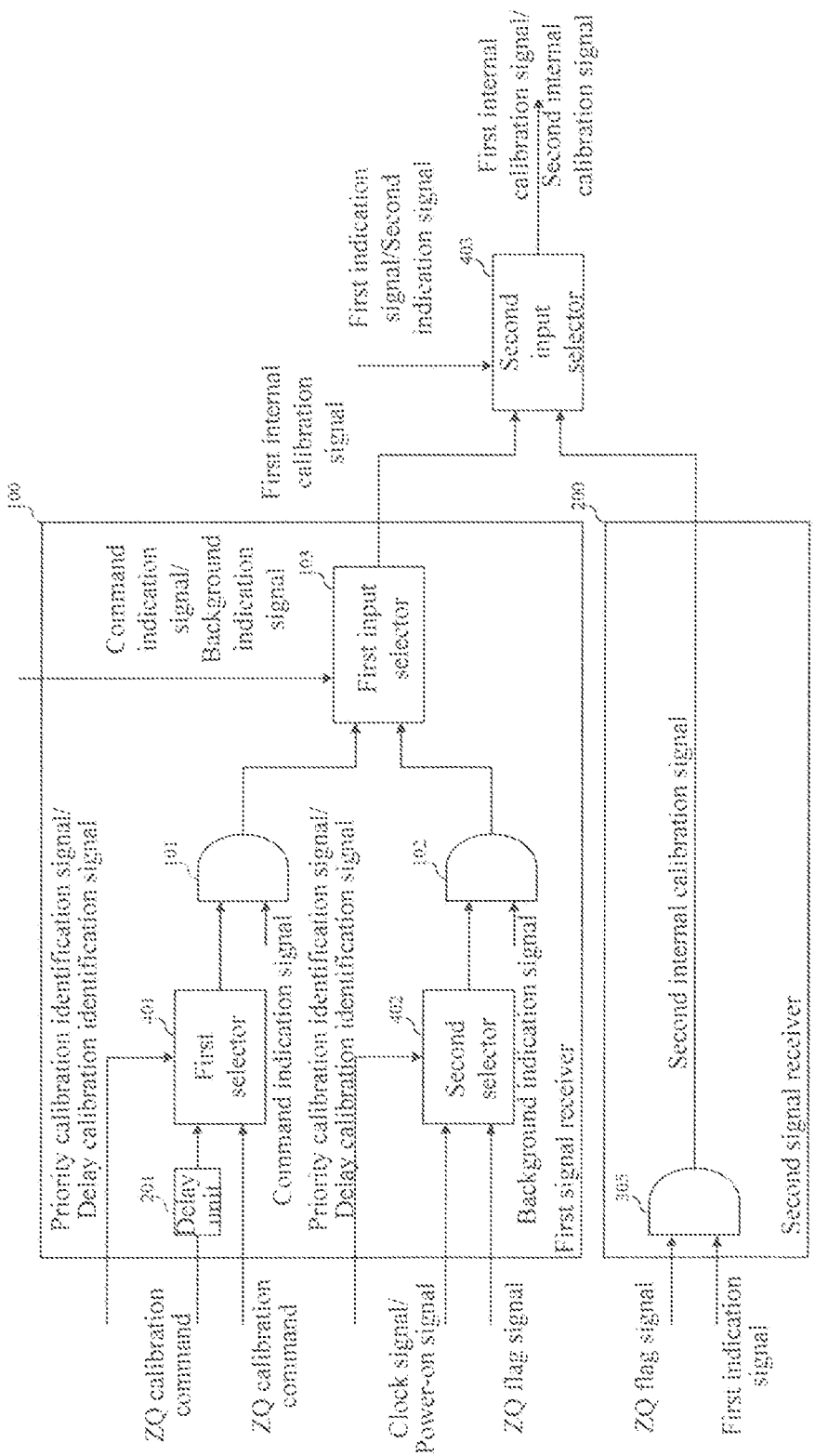
FIG. 8 is a schematic structural diagram of integration of a first signal receiver and a second signal receiver according to an embodiment of the present disclosure.
Figure 9:
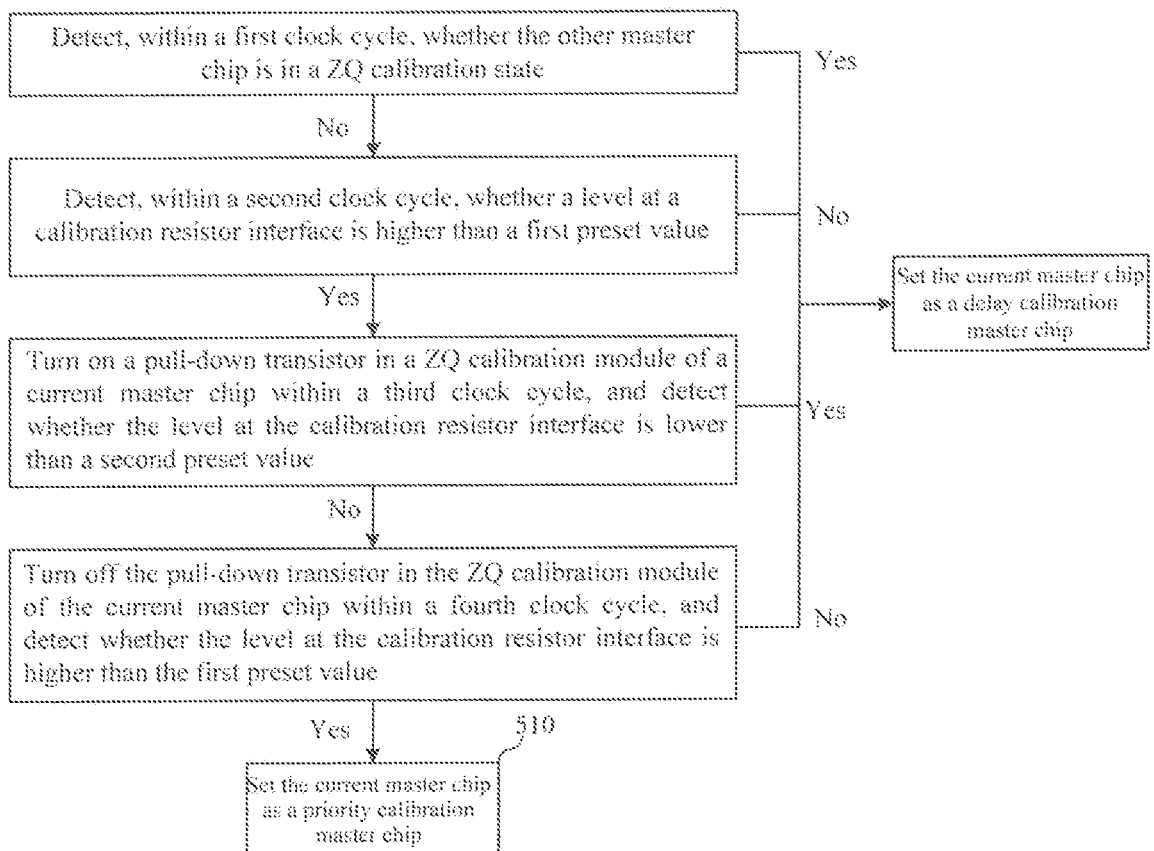
FIG. 9 is a schematic diagram of an identification flow of an identification module according to an embodiment of the present disclosure.

FIG. 1 is a schematic receiving diagram of two calibration resistor interfaces connected to a same ZQ calibration resistor according to this embodiment. FIG. 2 to FIG. are schematic structural diagrams of a memory device in various connection modes according to this embodiment. FIG. 6 is a schematic structural diagram of a first signal receiver according to this embodiment. FIG. 7 is a schematic structural diagram of a second signal receiver according to this embodiment. FIG. 8 is a schematic structural diagram of integration of a first signal receiver and a second signal receiver according to this embodiment. FIG. 9 is a schematic diagram of an identification flow of an identification module according to this embodiment. The structure of the memory device according to this embodiment is described in detail below with reference to the accompanying drawings, and the details are as follows:

A memory device includes: two calibration resistor interfaces.

The two calibration resistor interfaces connected to a same ZQ calibration resistor.

Referring to FIG. 1, the memory device is an LPDDR5 memory device 10. The LPDDR5 memory device 10 includes a first calibration resistor interface, a second calibration resistor interface, a first calibration command interface, and a second calibration command interface. A calibration command received through the first calibration command interface is calibrated by a calibration resistor connected to the first calibration resistor interface, and a calibration command received through the second calibration command interface is calibrated by a calibration resistor connected to the second calibration resistor interface. In this embodiment, the first calibration resistor interface and the second calibration resistor interface are commonly connected to a same ZQ calibration resistor Rzq. Correspondingly, the first calibration command interface and the second calibration command interface are calibrated by the ZQ calibration resistor Rzq based on the ZQ calibration command.

Referring to FIG. 2 to FIG. 5, the memory device further includes a first master chip, a plurality of cascaded first slave chips, a second master chip, and a plurality of cascaded second slave chips that are all connected to the ZQ calibration resistor.

The first master chip, the first slave chips, the second master chip, and the second slave chips are each provided with a first transmission terminal A and a second transmission terminal B that each are configured to transmit a ZQ flag signal.

It should be noted that the "cascading/cascaded" mentioned above means that: the plurality of first slave chips are respectively a first slave chip of a first stage, a first slave chip of a second stage, . . . , a first slave chip of an (M−1)-th stage, and a first slave chip of an M-th stage, which are connected end to end; and the plurality of second slave chips are respectively a second slave chip of a first stage, a second slave chip of a second stage, . . . , a second slave chip of a (K−1)-th stage, and a second slave chip of a K-th stage, which are connected end to end. The second transmission terminal B of the first master chip is connected to the first transmission terminal A of the first slave chip of a first stage, and the second transmission terminal B of the first slave chip of each stage is connected to the first transmission terminal A of the first slave chip of a next stage. The second transmission terminal B of the second master chip is connected to the first transmission terminal A of the second slave chip of a first stage, and the second transmission terminal B of the second slave chip of each stage is connected to the first transmission terminal A of the second slave chip of a next stage.

A first signal receiver is provided in each of the first master chip and the second master chip, and a second signal receiver is provided in each of the first slave chip and the second slave chip.

The identification module is configured to identify one of the first master chip and the second master chip as a priority calibration chip and the other one as a delay calibration chip, and the first slave chip or the second slave chip cascaded with the priority calibration chip as a primary slave chip, and the first slave chip or the second slave chip cascaded with the delay calibration chip as a secondary slave chip.

For example, in the command mode, the first signal receiver is configured to receive, through the ZQ signal terminal, the ZQ calibration command provided by the memory, or perform delay processing on the ZQ calibration command after receiving the ZQ calibration command through the ZQ signal terminal. The priority calibration chip starts the calibration based on the ZQ calibration command, the delay calibration chip starts the calibration based on the delayed ZQ calibration command, the first master chip and the second master chip send the ZQ flag signal through the second transmission terminals after completing the calibration, and the ZQ flag signal indicates that the current chip has performed the calibration by the calibration resistor. The second signal receiver is configured to receive the ZQ flag signal through the first transmission terminal A, the primary slave chip and the secondary slave chip start the calibration based on the ZQ flag signal, and the current primary slave chip and the current secondary slave chip send the ZQ flag signal through the second transmission terminals B after completing the calibration, until all the first slave chips or all the second slave chips complete the calibration.

In the memory device provided in this embodiment, a plurality of chips calibrated through a first calibration interface are configured as one first master chip and a plurality of first slave chips, and a plurality of chips calibrated through a second calibration interface are configured as one second master chip and a plurality of second slave chips. The identification module identifies the priority calibration chip and the delay calibration chip in the first master chip and the second master chip, and identifies the first slave chip or the second slave chip cascaded with the priority calibration chip as a primary slave chip and the first slave chip or the second slave chip cascaded with the delay calibration chip as a secondary slave chip. The priority calibration chip performs ZQ calibration by using a calibration resistor based on a ZQ calibration command provided by a memory, and the delay calibration chip performs the ZQ calibration after a certain delay by using the calibration resistor based on the ZQ calibration command provided by the memory. After the priority calibration chip and the delay calibration chip complete the ZQ calibration by using the calibration resistor, the ZQ flag signal is sent to the primary slave chip and the secondary slave chip, and the primary slave chip and the secondary slave chip sequentially perform the ZQ calibration by using the calibration resistor based on the ZQ flag signal, thereby realizing that a plurality of chips, theoretically having no quantitative limitation, share the ZQ calibration resistor to perform the ZQ calibration.

It should be noted that, for "delay" mentioned above, in some embodiments, it means delaying for half calibration cycle. That is, within the first half calibration cycle, the priority calibration chip and the primary slave chip perform the calibration based on the ZQ calibration resistor; and within the latter half calibration cycle, the delay calibration chip and the secondary slave chip perform the calibration based on the ZQ calibration resistor. The specific delay time for which the delay is performed may be limited according to the number of chips. The number of chips includes the number of chip groups and the total number of master chips and slave chips in a same chip group. This embodiment does not limit the specific delay time.

The first master chip, the first slave chips, the second master chip, and the second slave chips shown in FIG. 2 to FIG. 5 are configured to perform chip resetting according to reset signals, select target chips according to gating signals and enable the target chips, and write or read data according to clock signals and data signals. It should be noted that the reset signals, the data signals, the clock signals and the gating signals shown in FIG. 2 to FIG. 5 embody the working schemes of the first master chip, the first slave chips, the second master chip, and the second slave chips, and do not limit the structure of the memory device.

Referring to FIG. 2 to FIG. 5, in some embodiments, the second transmission terminal B of the first slave chip of a last stage is connected to the first transmission terminal A of the first master chip, and the second transmission terminal B of the second slave chip of a last stage is connected to the first transmission terminal A of the second master chip. The first master chip receives the ZQ flag signal, indicating that all the first slave chips complete the ZQ calibration. The second master chip receives the ZQ flag signal, indicating that all the second slave chips complete the ZQ calibration. The memory can perform a next operation.

Figure 4:
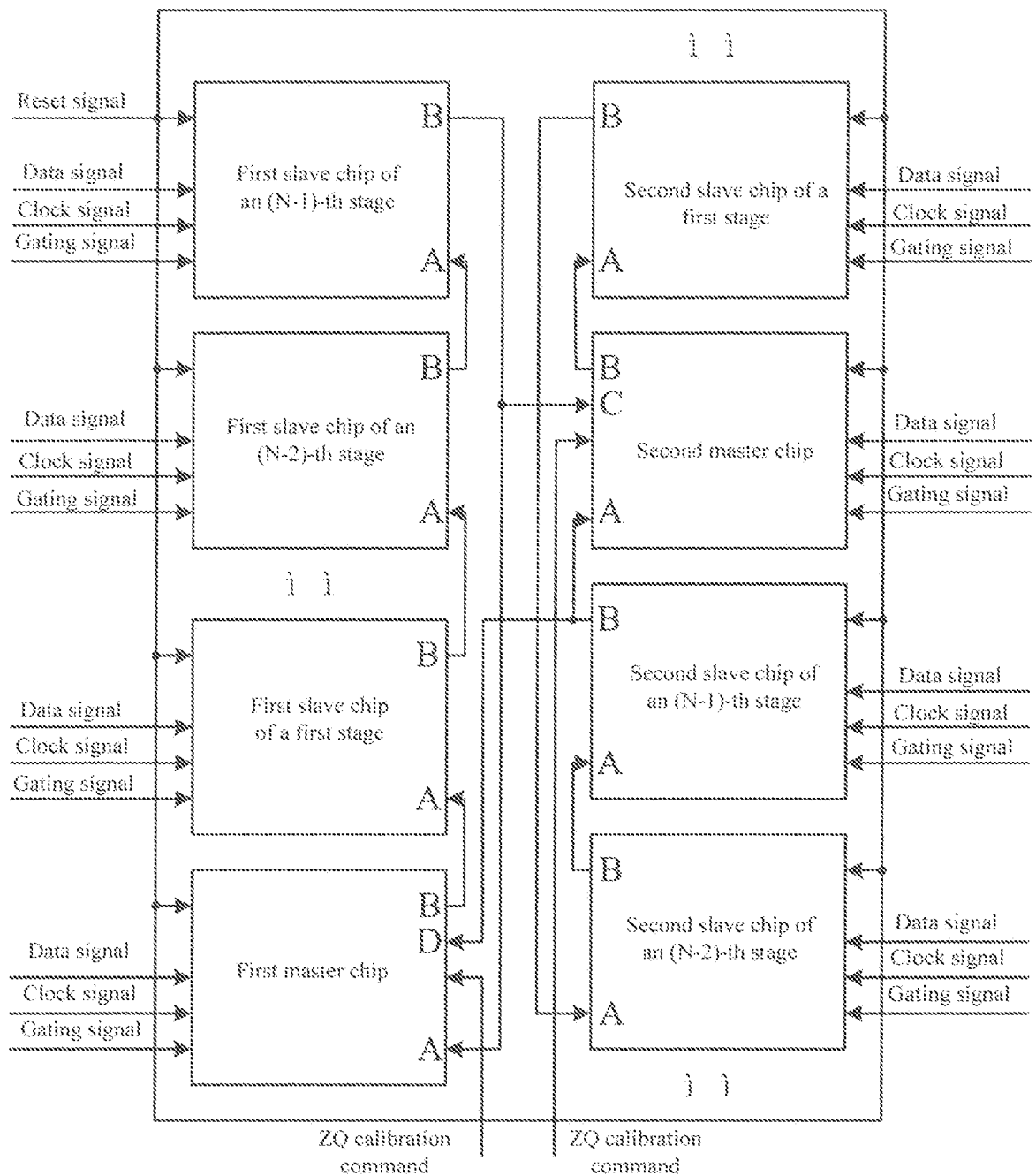
Figure 5:
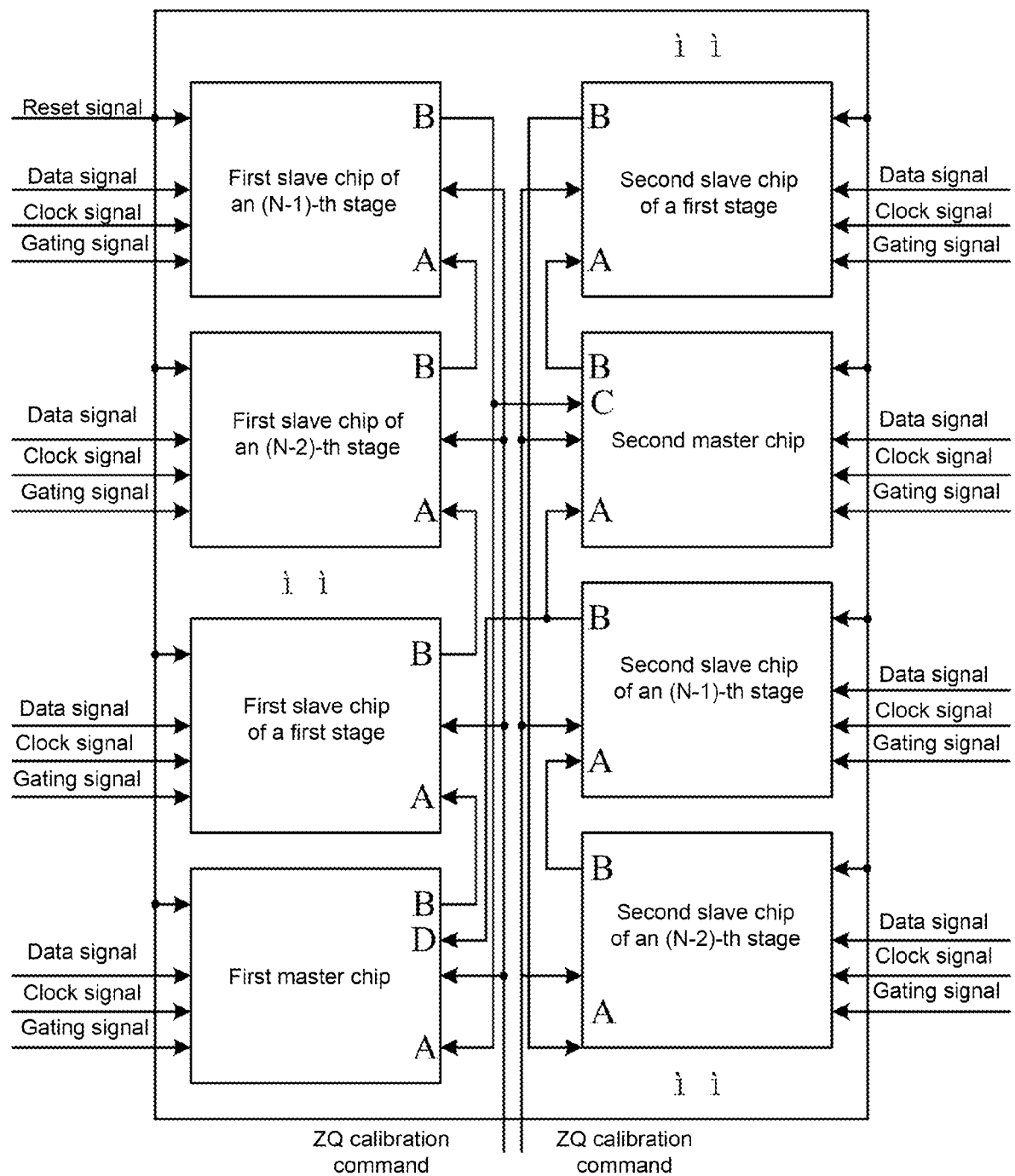

Referring to FIG. 4 and FIG. 5, in some embodiments, the delay calibration chip further includes: a third transmission terminal C started in a background mode and configured to receive the ZQ flag signal. For example, the third transmission terminal C is configured to receive the ZQ flag signal sent by the primary slave chip of the last stage. In the background mode, the delay calibration chip starts the calibration based on the ZQ flag signal.

The identification module is configured to identify the priority calibration chip and the delay calibration chip before entering the background mode.

In the background mode, the first signal receiver is configured to receive, through the ZQ signal terminal, the clock signal or the power-on signal provided by the memory. The priority calibration chip starts the calibration based on the clock signal or the power-on signal, and the priority calibration chip sends the ZQ flag signal through the second transmission terminal after completing the calibration. The primary slave chip, the delay calibration chip, and the secondary slave chip sequentially start the calibration based on the ZQ flag signal. For example, the priority calibration chip sends the ZQ flag signal through the second transmission terminal B to the primary slave chip of the first stage after completing the calibration, and the ZQ flag signal sent after the primary slave chip of the last stage completing the ZQ calibration is received by the delay calibration chip through the third transmission terminal C. The delay calibration chip performs the calibration based on the ZQ flag signal, and the delay calibration chip sends the ZQ flag signal to the secondary slave chip of the first stage through the second transmission terminal B after completing the ZQ calibration, until the secondary slave chip of the last stage completes the ZQ calibration.

In some embodiments, the priority calibration chip further includes a fourth transmission terminal D. The fourth transmission terminal D is started in the background mode, configured to transmit the ZQ flag signal, and connected to the second transmission terminal B of the secondary slave chip of the last stage. The priority calibration chip receives the ZQ flag signal, indicating that all the slave chips complete the ZQ calibration in the background mode. The memory can perform a next operation. It should be noted that in the command mode, the priority calibration chip receives, through the first transmission terminal, the ZQ flag signal sent by the primary slave chip of the last stage; and in the background mode, the priority calibration chip receives, through the fourth transmission terminal, the ZQ flag signal sent by the secondary slave chip of the last stage.

It should be noted that, FIG. 2 to FIG. 5 are example diagrams where the first master chip serves as the priority calibration chip, the first slave chip serves as the primary slave chip, the second master chip serves as the delay calibration chip, and the second slave chip serves as the secondary slave chip, are only for those skilled in the art to know the implementation of the calibration flow of the present disclosure, and do not limit this embodiment. In other embodiments, similarly, the second master chip serves as the priority calibration chip, the second slave chip serves as the primary slave chip, the first master chip serves as the delay calibration chip, and the first slave chip serves as the secondary slave chip.

In some embodiments, referring to FIG. 6, the first signal receiver 100 includes: a first selector 401 having one input terminal configured to receive the ZQ calibration command, the other input terminal configured to receive the delayed ZQ calibration command, and a selection terminal configured to receive a priority calibration identification signal or a delay calibration identification signal, and configured to output the ZQ calibration command based on the priority calibration identification signal or output the delayed ZQ calibration command based on the delay calibration identification signal, where a priority calibration identification signal indicates that the current master chip is the priority calibration chip, and a delay calibration identification signal indicates that the current master chip is the delay calibration chip; a first AND gate 101 having one input terminal connected to an output terminal of the first selector 401 and the other input terminal configured to receive a command indication signal, where the command indication signal indicates that the memory operates in the command mode; a second selector 402 having one input terminal configured to receive the clock signal or the power-on signal, the other input terminal configured to receive the ZQ flag signal transmitted through the third transmission terminal, and a selection terminal configured to receive the priority calibration identification signal or the delay calibration identification signal, and configured to output the clock signal or the power-on signal based on the priority calibration identification signal or output the ZQ flag signal based on the delay calibration identification signal; a second AND gate 102 having one input terminal connected to an output terminal of the second selector 402 and the other input terminal configured to receive a background indication signal, where the background indication signal indicates that the memory operates in the background mode; and a first input selector 103 having a first input terminal connected to an output terminal of the first AND gate 101, a second input terminal connected to an output terminal of the second AND gate 102, a first selection terminal configured to receive the command indication signal or the background indication signal, and a first output terminal configured to output a first internal calibration signal, where the first internal calibration signal instructs the priority calibration chip and the delay calibration chip to perform the calibration, and the first input selector 103 is configured to connect the first input terminal to the first output terminal based on the command indication signal, or connect the second input terminal to the first output terminal based on the background indication signal.

In some embodiments, the memory device further includes a delay unit 201 configured to delay the ZQ calibration signal received by the first signal receiver 100. The delay unit 201 delays the ZQ calibration command. The delay unit 201 may be composed of even number of inverters. The present disclosure does not limit the structure of the delay unit 201.

It should be noted that, for the command mode and the background mode mentioned in this embodiment, the memory is started based on a preset command in the command mode, the memory is started based on an internal signal of the memory in the background mode, and the internal signal includes the power-on signal and the clock signal.

In some embodiments, if the first signal receiver 100 receives the priority calibration identification signal, after the first selector 401 and the second selector 402 selectively turn on a channel, the first signal receiver 100 is configured to instruct the priority calibration chip to operate. For example, when the memory is in the command mode, the command indication signal is provided to the first signal receiver 100, and the first input selector 103 connects the first input terminal to the first output terminal based on the command indication signal. At this time, the first signal receiver 100 provides the first internal calibration signal based on the output of the first AND gate 101. That is, when the first signal receiver 100 receives the ZQ calibration command, the first internal calibration signal is generated, thereby controlling the priority calibration chip to perform the ZQ calibration. When the memory is in the background mode, the background indication signal is provided to the first signal receiver 100, and the first input selector 103 connects the second input terminal to the first output terminal based on the background indication signal. At this time, the first signal receiver 100 provides the first internal calibration signal based on the output of the second AND gate 102. That is, when the first signal receiver 100 receives the clock signal or the power-on signal, the first internal calibration signal is generated, thereby controlling the priority calibration chip to perform the ZQ calibration.

If the first signal receiver 100 receives the delay calibration identification signal, after the first selector 401 and the second selector 402 selectively turn on a channel, the first signal receiver 100 is configured to instruct the delay calibration chip to operate. For example, when the memory is in the command mode, the command indication signal is provided to the first signal receiver 100, and the first input selector 103 connects the first input terminal to the first output terminal based on the command indication signal. At this time, the first signal receiver 100 provides the first internal calibration signal based on the output of the first AND gate 101. That is, when the first signal receiver 100 receives the delayed ZQ calibration command, the first internal calibration signal is generated, thereby controlling the delay calibration chip to perform the ZQ calibration. When the memory is in the background mode, the background indication signal is provided to the first signal receiver 100, and the first input selector 103 connects the second input terminal to the first output terminal based on the background indication signal. At this time, the first signal receiver 100 provides the first internal calibration signal based on the output of the second AND gate 102. That is, when the first signal receiver 100 receives the ZQ flag signal, the first internal calibration signal is generated, thereby controlling the delay calibration chip to perform the ZQ calibration.

In some embodiments, referring to FIG. 7, the second signal receiver 200 includes: a third AND gate 305 having one input terminal configured to receive the ZQ flag signal, the other input terminal configured to receive a first indication signal, and an output terminal configured to output a second internal calibration signal, where the first indication signal indicates that the current chip is the first slave chip or the second slave chip, and the second internal calibration signal instructs the first slave chip or the second slave chip to perform the calibration.

For example, the second signal receiver 200 is arranged in the first slave chip or the second slave chip. The second signal receiver 200 continuously receives the first indication signal. In this way, when the third signal receiver 300 receives the ZQ flag signal, the second internal calibration signal can be generated, thereby controlling the first slave chip and the second slave chip to perform the ZQ calibration.

Figure 3:
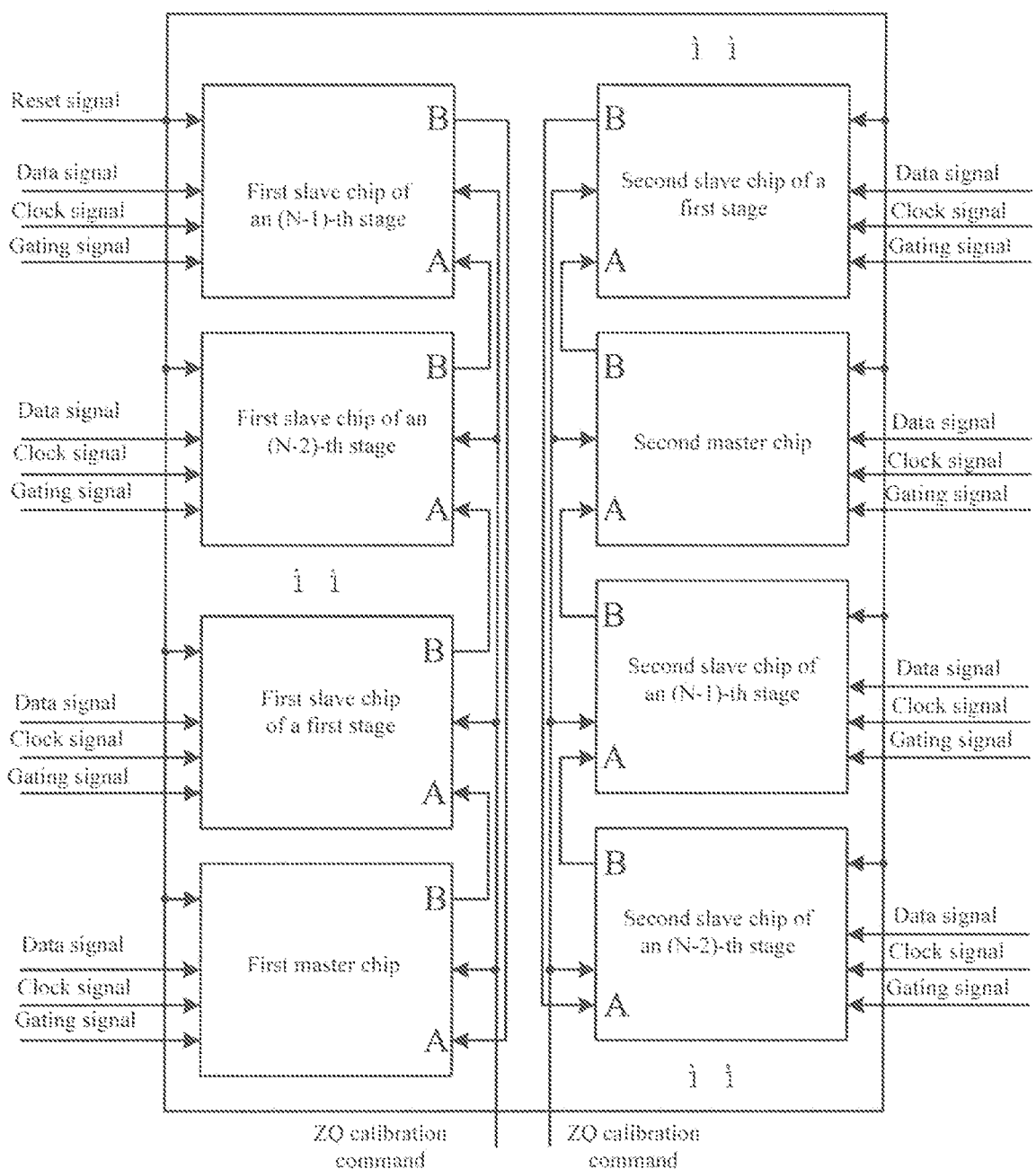

In the memory device structure shown in FIG. 2 and FIG. 4, only the first master chip and the second master chip receive the ZQ calibration command, and there are differences in structures of the first master chip, the first slave chips, the second master chip and the second slave chips. Referring to FIG. 3 and FIG. 5, in some embodiments, the first master chip, the first slave chips, the second master chip and the second slave chips have the same structure. At this time, the first slave chips and the second slave chips also need to receive the ZQ calibration command. The first master chip and the second master chip each further include the second signal receiver 200. The first slave chips and the second slave chips each further include the first signal receiver 100.

Referring to FIG. 8, the first master chip, the first slave chips, the second master chip, and the second slave chips each further include: a second input selector 403 having a third input terminal configured to receive the first internal calibration signal, a fourth input terminal configured to receive the second internal calibration signal, a second selection terminal configured to receive the first indication signal or a second indication signal, and a second output terminal configured to output the first internal calibration command and the second internal calibration command, where the second indication signal indicates that the current chip is the priority calibration chip or the delay calibration chip, and the second input selector 403 is configured to connect the fourth input terminal to the second output terminal based on the first indication signal, or connect the third input terminal to the second output terminal based on the second indication signal.

For example, the second input selector 403 selects a signal to output based on the first indication signal and the second indication signal. Receiving the second indication signal indicates that the current chip is the priority calibration chip or the delay calibration chip, namely the first master chip or the second master chip. The second input selector 403 selects an output signal of the first signal receiver 100 to output. Receiving the first indication signal indicates that the current chip is the first slave chip or the second slave chip. The second input selector 403 selects an output signal of the second signal receiver 200 to output.

Referring to FIG. 2 to FIG. 5, in this embodiment, the number of the second slave chips is equal to the number of the first slave chips; the first master chip and the first slave chips are arranged in a first array of one column and N rows, and the first master chip is arranged at a position in an N-th row; the second master chip and the second slave chips are arranged in a second array of one column and N rows, and the second master chip is arranged at a position in an N/2-th row, where N−1 is the number of the first slave chips and the second slave chips. In other embodiments, the chips can be arranged in an array of i columns and j rows according to the number of the chips and the layout area to be set. At this time, the first master chip is arranged at a position of a first column and a j-th row, and the second master chip is arranged at a position of an (i/2+1)-th column and a j/2-th row.

It can be understood that the number of chips in a loop varies with a mode of the memory. In the embodiments of the present disclosure, in the command mode, the memory includes two calibration loops, and each calibration loop includes a master chip and N−1 slave chips; and in the background mode, the memory includes only one calibration loop, and the calibration loop includes two master chips and 2N−2 slave chips.

For the identification module mentioned in the embodiments, the identification module is integrated in the first master chip or the second master chip, or is integrated in the first master chip and the second master chip, but only one identification module is enabled at a same time. Referring to FIG. 9, the identification module is configured to detect, within a first clock cycle, whether the other master chip is in a ZQ calibration state. For example, if the other master chip is in the ZQ calibration state, there is already a master chip that is calibrated prior to the current master chip, and the identification module sets the current master chip as the delay calibration chip and sets the other master chip as the priority calibration chip. If the other master chip is not in the ZQ calibration state, there is no master chip that is calibrated in the current state, and the identification module sets the current master chip as the priority calibration chip and sets the other master chip as the delay calibration chip.

It should be noted that, the means for the identification module to detect whether the other master chip is in the ZQ calibration state is to detect a flag bit of the master chip, and the flag bit indicates whether the loop in which the master chip is located is in the ZQ calibration state. Specifically, when the master chip receives the ZQ calibration command or receives the ZQ flag signal for the first time, the flag bit is in a first state. Correspondingly, after the master chip having the flag bit in the first state receives the ZQ flag signal, the flag bit is in a second state.

To ensure the identification accuracy of the identification module, still referring to FIG. 9, before the current master chip is set as the priority calibration chip, the identification module is further configured to detect, during a second clock cycle, whether a level at the calibration resistor interface is higher than a first preset value. Specifically referring to FIG. 1, in one example, the first preset value is set as $V_{DDQ}/2$. When there is a master chip performing the calibration by using the calibration resistor Rzq, the level at the calibration resistor interface drops. When there is no master chip performing the calibration by using the calibration resistor Rzq, the level at the calibration resistor interface is close to $V_{DDQ}$. Therefore, if the level at the calibration resistor interface is lower than the first preset value, the identification module sets the current master chip as the delay calibration chip and sets the other master chip as the priority calibration chip; and if the level at the calibration resistor interface is higher than the first preset value, the identification module sets the current master chip as the priority calibration chip and sets the other master chip as the delay calibration chip.

To further ensure the identification accuracy of the identification module, still referring to FIG. 9, before the current master chip is set as the priority calibration chip, the identification module is further configured to turn on a pull-down transistor in the ZQ calibration module of the current master chip during a third clock cycle and detect whether the level at the calibration resistor interface is lower than a second preset value. Specifically referring to FIG. 1, in one example, the first preset value is set as $V_{DDQ}/4$. When there are a plurality of master chips performing the calibration by using the calibration resistor Rzq, the level at the calibration resistor interface further drops. Therefore, if the level at the calibration resistor interface is lower than the second preset value, the identification module sets the current master chip as the delay calibration chip and sets the other master chip as the priority calibration chip; and if the level at the calibration resistor interface is higher than the second preset value, the identification module sets the current master chip as the priority calibration chip and sets the other master chip as the delay calibration chip.

To further ensure the identification accuracy of the identification module, still referring to FIG. 9, before the current master chip is set as the priority calibration chip, the identification module is further configured to turn off the pull-down transistor in the ZQ calibration module in the current master chip during a fourth clock cycle and detect whether the level at the calibration resistor interface is higher than the first preset value. When there is a master chip performing the calibration by using the calibration resistor Rzq, the level at the calibration resistor interface drops. When there is no master chip performing the calibration by using the calibration resistor Rzq, the level at the calibration resistor interface is close to $V_{DDQ}$. Therefore, if the level at the calibration resistor interface is lower than the first preset value, the current master chip is set as the delay calibration chip and the other master chip is set as the priority calibration chip; and if the level at the calibration resistor interface is higher than the first preset value, the current master chip is set as the priority calibration chip and the other master chip is set as the delay calibration chip.

It should be noted that, the above example sets the first preset value as $V_{DDQ}/2$, and does not limit the first preset value. The first preset value may be set as any threshold, and the threshold is the value of the level at the calibration resistor interface and is configured to distinguish whether there is a chip performing the calibration by using the calibration resistor. In addition, the above example sets the second preset value as $V_{DDQ}/4$, and does not limit the second preset value. The second preset value may be set as any threshold, and the threshold is the value of the level at the calibration resistor interface and is configured to distinguish whether there are a plurality of chips performing the calibration by using the calibration resistor.

In the memory device provided in this embodiment, a plurality of chips calibrated through a first calibration interface are configured as one first master chip and a plurality of first slave chips, and a plurality of chips calibrated through a second calibration interface are configured as one second master chip and a plurality of second slave chips. The identification module identifies the priority calibration chip and the delay calibration chip in the first master chip and the second master chip, and identifies the first slave chip or the second slave chip cascaded with the priority calibration chip as a primary slave chip and the first slave chip or the second slave chip cascaded with the delay calibration chip as a secondary slave chip. The priority calibration chip performs ZQ calibration by using a calibration resistor based on a ZQ calibration command provided by a memory, and the delay calibration chip performs the ZQ calibration after a certain delay by using the calibration resistor based on the ZQ calibration command provided by the memory. After the priority calibration chip and the delay calibration chip complete the ZQ calibration by using the calibration resistor, the ZQ flag signal is sent to the primary slave chip and the secondary slave chip, and the primary slave chip and the secondary slave chip sequentially perform the ZQ calibration by using the calibration resistor based on the ZQ flag signal, thereby realizing that a plurality of chips, theoretically having no quantitative limitation, share the ZQ calibration resistor to perform the ZQ calibration.

It should be noted that, when the ZQ calibration time is limited, the chips sharing the ZQ calibration resistor are also limited. The longer the time it takes for each chip to perform the ZQ calibration, the fewer chips that share the ZQ calibration resistor. In addition, the features disclosed in the memory device according to the above embodiment may be combined freely without conflicts to obtain a new embodiment of the memory device.

Another embodiment of the present disclosure provides a ZQ calibration method, applied to the memory device according to the above embodiment, thereby realizing that a plurality of chips, theoretically having no quantitative limitation, share the ZQ calibration resistor to perform the ZQ calibration.

Figure 10:
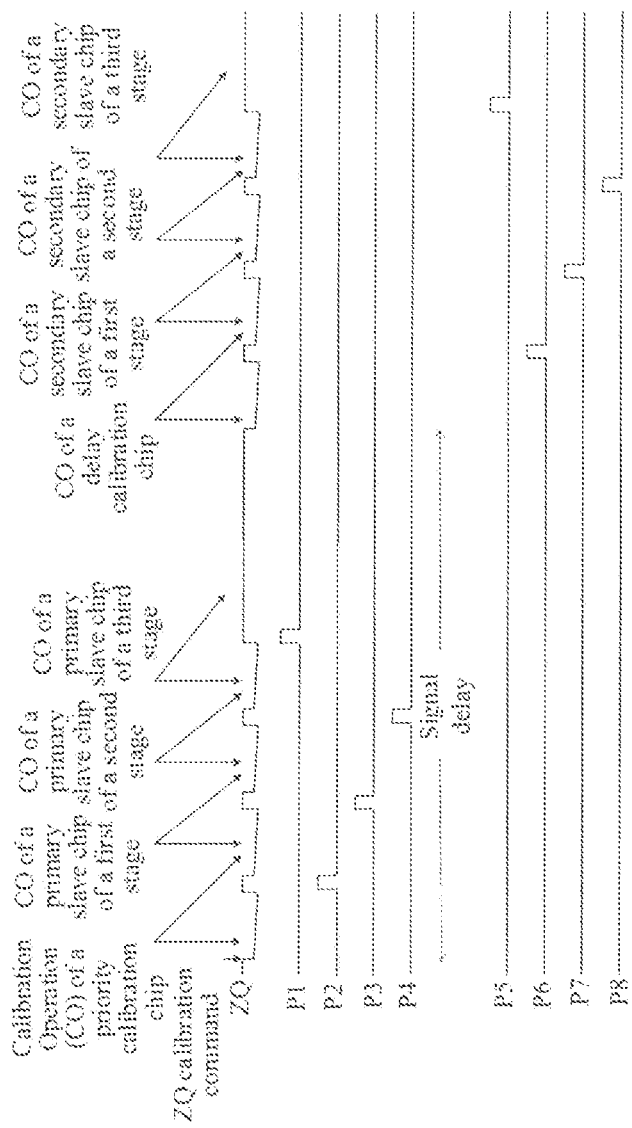
FIG. 10 is a schematic diagram of timing corresponding to a ZQ calibration method when a memory device is in a command mode according to another embodiment of the present disclosure.
Figure 11:
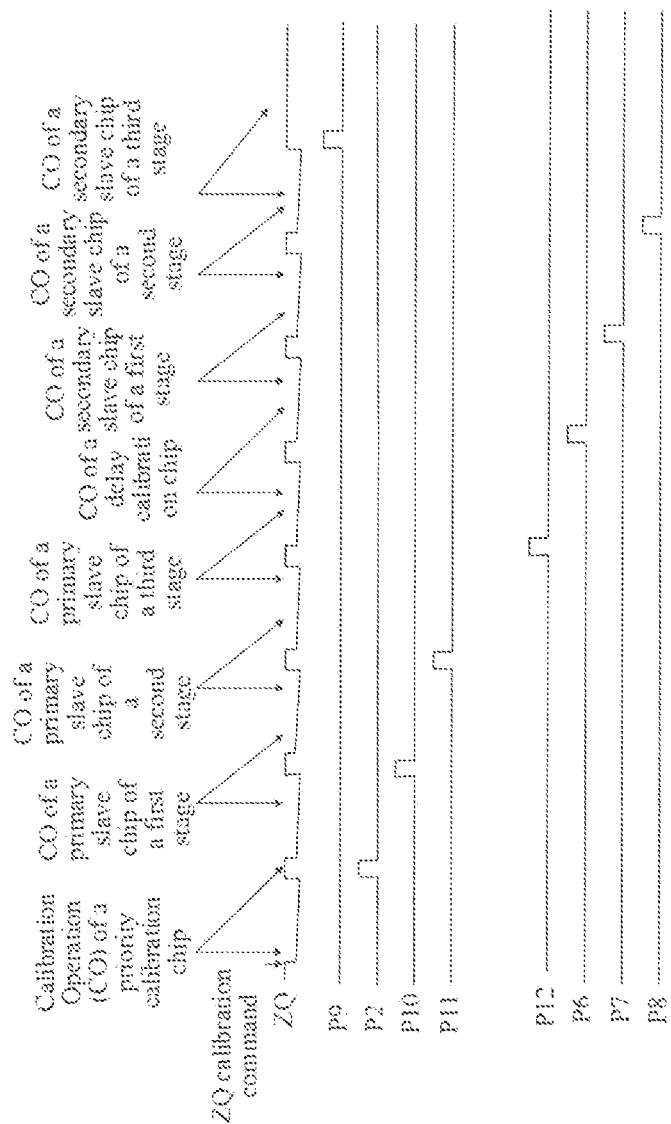
FIG. 11 is a schematic diagram of timing corresponding to a ZQ calibration method when a memory device is in a background mode according to another embodiment of the present disclosure.

FIG. 10 is a schematic diagram of timing corresponding to a ZQ calibration method when a memory device is in a command mode according to this embodiment. FIG. 11 is a schematic diagram of timing corresponding to a ZQ calibration method when a memory device is in a background mode according to this embodiment. The ZQ calibration method according to this embodiment is described in detail below with reference to the accompanying drawings, and the details may be as follows:

Referring to FIG. 10, the ZQ calibration method includes: identifying the priority calibration chip and the delay calibration chip in the first master chip and the second master chip, taking the first slave chip or the second slave chip cascaded with the priority calibration chip as the primary slave chip, and taking the first slave chip or the second slave chip cascaded with the delay calibration chip as the secondary slave chip; in a command mode, obtaining a ZQ calibration command applied outside the memory device, performing a first calibration on the priority calibration chip in response to the ZQ calibration command, after the first calibration is completed, transmitting a ZQ flag signal to the primary slave chip of a first stage, and performing a second calibration on the priority calibration chip; performing the first calibration on the primary slave chip of the first stage in response to the ZQ flag signal, after the first calibration on the primary slave chip of the first stage is completed, transmitting the ZQ flag signal to the primary slave chip of the next stage, and performing the second calibration on the primary slave chip of the first stage, until the first calibration performed on the primary slave chip of the last stage is completed, completing the second calibration on the primary slave chip of the last stage; performing the first calibration on the delay calibration chip in response to the delayed ZQ calibration command, after the first calibration is completed, transmitting the ZQ flag signal to the secondary slave chip of the first stage, and performing the second calibration on the delay calibration chip at the same time; performing the first calibration on the secondary slave chip of the first stage in response to the ZQ flag signal, after the first calibration on the secondary slave chip of the first stage is completed, transmitting the ZQ flag signal to the secondary slave chip of a next stage, and performing the second calibration on the secondary slave chip of the first stage, until the first calibration performed on the secondary slave chip of a last stage is completed, and completing the second calibration on the secondary slave chip of the last stage.

In some embodiments, while completing the second calibration on the primary slave chip of the last stage, the ZQ calibration method further includes: transmitting the ZQ flag signal to the priority calibration chip. While completing the second calibration on the secondary slave chip of the last stage, the ZQ calibration method further includes: transmitting the ZQ flag signal to the delay calibration chip. The priority calibration chip receives the ZQ flag signal, indicating that all the primary slave chips have completed the ZQ calibration. The delay calibration chip receives the ZQ flag signal, indicating that all the secondary slave chips have completed the ZQ calibration. The memory can perform a next operation.

It should be noted that the schematic diagram of timing of ZQ calibration shown in FIG. 10 is described by taking three stages of slave chips as an example, which is merely for those skilled in the art to know the realization of ZQ calibration in the embodiment of the present disclosure, and does not limit this embodiment. Based on the illustration of FIG. 10 and the ZQ calibration method mentioned above, those skilled in the art can continue to derive the timing in FIG. 10 to the situation applicable to K first slave chips and K second slave chips.

Referring to FIG. 11, the ZQ calibration method further includes: identifying the priority calibration chip and the delay calibration chip in the first master chip and the second master chip, taking the first slave chip or the second slave chip cascaded with the priority calibration chip as the primary slave chip, and taking the first slave chip or the second slave chip cascaded with the delay calibration chip as the secondary slave chip; performing the first calibration on the priority calibration chip in response to the ZQ calibration command in the background mode; after the first calibration is completed, transmitting the ZQ flag signal to the primary slave chip of the first stage, and performing the second calibration on the priority calibration chip; performing the first calibration on the primary slave chip of the first stage in response to the ZQ flag signal; after the first calibration performed on the primary slave chip of the first stage is completed, transmitting the ZQ flag signal to the primary slave chip of the next stage, and performing the second calibration on the primary slave chip of the first stage at the same time, until the first calibration performed on the primary slave chip of the last stage is completed; transmitting the ZQ flag signal to the delay calibration chip, and performing the second calibration on the primary slave chip of the last stage; performing the first calibration on the delay calibration chip in response to the ZQ flag signal; after the first calibration is completed, transmitting the ZQ flag signal to the secondary slave chip of the first stage, and performing the second calibration on the delay calibration chip at the same time; performing the first calibration on the secondary slave chip of the first stage in response to the ZQ flag signal; after the first calibration performed on the secondary slave chip of the first stage is completed, transmitting the ZQ flag signal to the secondary slave chip of a next stage, and performing the second calibration on the secondary slave chip of the first stage at the same time, until the first calibration performed on the secondary slave chip of a last stage is completed; and completing the second calibration on the secondary slave chip of the last stage.

In some embodiments, in the background mode, while completing the second calibration on the secondary slave chip of the last stage, the ZQ calibration method further includes: transmitting the ZQ flag signal to the priority calibration chip. The priority calibration chip receives the ZQ flag signal, indicating that all the chips complete the ZQ calibration and the memory can perform a next operation.

It should be noted that the schematic diagram of timing of ZQ calibration shown in FIG. 11 is described by taking three stages of slave chips as an example, which is merely for those skilled in the art to know the realization of ZQ calibration in the embodiment of the present disclosure, and does not limit this embodiment. Based on the illustration of FIG. 11 and the ZQ calibration method mentioned above, those skilled in the art can continue to derive the timing in FIG. 11 to the situation applicable to K first slave chips and K second slave chips.

In some embodiments, before entering the background mode, the priority calibration chip and the delay calibration chip in the first master chip, the second master chip, the first slave chips and the second slave chips are identified. The first slave chip or the second slave chip cascaded with the priority calibration chip is the primary slave chip, and the first slave chip or the second slave chip cascaded with the delay calibration chip is the secondary slave chip.

For example, referring to FIG. 9, it is detected, during a first clock cycle, whether the other master chip is in a ZQ calibration state. For example, if the other master chip is in the ZQ calibration state, there is already a master chip that is calibrated prior to the current master chip, the current master chip is set as the delay calibration chip and the other master chip is set as the priority calibration chip. If the other master chip is not in the ZQ calibration state, there is no master chip that is calibrated in the current state, the current master chip is set as the priority calibration chip and the other master chip is set as the delay calibration chip.

To ensure the identification accuracy, still referring to FIG. 9, before the current master chip is set as the priority calibration chip, it is further configured to detect, during a second clock cycle, whether a level at the calibration resistor interface is higher than a first preset value. Specifically referring to FIG. 1, in one example, the first preset value is set as $V_{DDQ}/2$. When there is a master chip performing the calibration by using the calibration resistor Rzq, the level at the calibration resistor interface drops. When there is no master chip performing the calibration by using the calibration resistor Rzq, the level at the calibration resistor interface is close to $V_{DDQ}$. Therefore, if the level at the calibration resistor interface is lower than the first preset value, the current master chip is set as the delay calibration chip and the other master chip is set as the priority calibration chip; and if the level at the calibration resistor interface is higher than the first preset value, the current master chip is set as the priority calibration chip and the other master chip is set as the delay calibration chip.

To further ensure the identification accuracy, still referring to FIG. 9, before the current master chip is set as the priority calibration chip, it is further configured to turn on a pull-down transistor in the ZQ calibration module of the current master chip during a third clock cycle and detect whether the level at the calibration resistor interface is lower than a second preset value. Specifically referring to FIG. 1, in one example, the first preset value is set as $V_{DDQ}/4$. When there are a plurality of master chips performing the calibration by using the calibration resistor Rzq, the level at the calibration resistor interface further drops. Therefore, if the level at the calibration resistor interface is lower than the second preset value, the current master chip is set as the delay calibration chip and the other master chip is set as the priority calibration chip; and if the level at the calibration resistor interface is higher than the second preset value, the current master chip is set as the priority calibration chip and the other master chip is set as the delay calibration chip.

To further ensure the identification accuracy, still referring to FIG. 9, before the current master chip is set as the priority calibration chip, it is further configured to turn off the pull-down transistor in the ZQ calibration module in the current master chip during a fourth clock cycle and detect whether the level at the calibration resistor interface is higher than the first preset value. When there is a master chip performing the calibration by using the calibration resistor Rzq, the level at the calibration resistor interface drops. When there is no master chip performing the calibration by using the calibration resistor Rzq, the level at the calibration resistor interface is close to $V_{DDQ}$. Therefore, if the level at the calibration resistor interface is lower than the first preset value, the current master chip is set as the delay calibration chip and the other master chip is set as the priority calibration chip; and if the level at the calibration resistor interface is higher than the first preset value, the current master chip is set as the priority calibration chip and the other master chip is set as the delay calibration chip.

It should be noted that, in the above example the first preset value is set as $V_{DDQ}/2$, which does not limit the first preset value. The first preset value may be set as any threshold, and the threshold is the value of the level at the calibration resistor interface and is configured to distinguish whether there is a chip performing the calibration by using the calibration resistor. In addition, in the above example the second preset value is set as $V_{DDQ}/4$, which does not limit the second preset value. The second preset value may be set as any threshold, and the threshold is the value of the level at the calibration resistor interface and is configured to distinguish whether there are a plurality of chips performing the calibration by using the calibration resistor.

It should be noted that in this embodiment, the first calibration is one of a pull-up calibration generating a pull-up calibration code and a pull-down calibration generating a pull-down calibration code, and the second calibration is the other one of the pull-up calibration and the pull-down calibration. The first calibration needs to perform the calibration by using the calibration resistor, and the second calibration needs to perform the calibration based on a result of the first calibration without using the calibration resistor. In addition, the features disclosed in the ZQ calibration method provided in the above embodiment can be arbitrarily combined without conflict, and a new ZQ calibration method embodiment can be obtained.

The embodiments or implementations of this specification are described in a progressive manner, and each embodiment focuses on differences from other embodiments. The same or similar parts between the embodiments may refer to each other.

In the description of this specification, the description referring to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail referring to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the memory device and the ZQ calibration method provided in the embodiments of the present disclosure, a plurality of chips calibrated through a first calibration interface are configured as one first master chip and a plurality of first slave chips, and a plurality of chips calibrated through a second calibration interface are configured as one second master chip and a plurality of second slave chips. The identification module identifies the priority calibration chip and the delay calibration chip in the first master chip and the second master chip, and identifies the first slave chip or the second slave chip cascaded with the priority calibration chip as a primary slave chip and the first slave chip or the second slave chip cascaded with the delay calibration chip as a secondary slave chip. The priority calibration chip performs ZQ calibration by using a calibration resistor based on a ZQ calibration command provided by a memory, and the delay calibration chip performs the ZQ calibration after a certain delay by using the calibration resistor based on the ZQ calibration command provided by the memory. After the priority calibration chip and the delay calibration chip have completed the ZQ calibration by using the calibration resistor, the ZQ flag signal is sent to the primary slave chip and the secondary slave chip, and the primary slave chip and the secondary slave chip sequentially perform the ZQ calibration by using the calibration resistor based on the ZQ flag signal, thereby realizing that a plurality of chips, theoretically having no quantitative limitation, share the ZQ calibration resistor to perform the ZQ calibration.

The invention claimed is:

1. A memory device, comprising:
two calibration resistor interfaces, connected to a same ZQ calibration resistor; and
a first master chip, a plurality of first slave chips cascaded together, a second master chip, and a plurality of second slave chips cascaded together that are all connected to the ZQ calibration resistor, wherein
the first master chip, the first slave chips, the second master chip, and the second slave chips are each provided with a first transmission terminal and a second transmission terminal, and each of the first transmission terminal and the second transmission terminal are configured to transmit a ZQ flag signal;
the second transmission terminal of the first master chip is connected to the first transmission terminal of a first slave chip of a first stage in the plurality of first slave chips, the second transmission terminal of a first slave chip of each stage is connected to the first transmission terminal of a first slave chip of a next stage, the second transmission terminal of the second master chip is connected to the first transmission terminal of a second slave chip of a first stage in the plurality of second slave chips, and the second transmission terminal of a second slave chip of each stage is connected to the first transmission terminal of a second slave chip of a next stage; and
a first signal receiver is provided in each of the first master chip and the second master chip, and a second signal receiver is provided in each of the plurality of first slave chips and the plurality of second slave chips; and
an identification module, configured to identify one of the first master chip and the second master chip as a priority calibration chip and the other one as a delay calibration chip, and the first slave chip or the second slave chip cascaded with the priority calibration chip as a primary slave chip and the first slave chip or the second slave chip cascaded with the delay calibration chip as a secondary slave chip, wherein
in a command mode, the first signal receiver is configured to receive, through a ZQ signal terminal, a ZQ calibration command provided by a memory, or perform delay processing on the ZQ calibration command after the ZQ calibration command is received through the ZQ signal terminal, the priority calibration chip starts calibration based on the ZQ calibration command, the delay calibration chip starts the calibration based on the delayed ZQ calibration command, the first master chip and the second master chip send the ZQ flag signal through the second transmission terminals after completing the calibration, and the ZQ flag signal indicates that a current chip has completed calibration by using the ZQ calibration resistor; and
the second signal receiver is configured to receive the ZQ flag signal through the first transmission terminal, the primary slave chip and the secondary slave chip start the calibration based on the ZQ flag signal, and a current primary slave chip and a current secondary slave chip send the ZQ flag signal through the second transmission terminals after completing the calibration, until all the first slave chips or all the second slave chips complete the calibration.

2. The memory device according to claim 1, wherein
the second transmission terminal of a first slave chip of a last stage in the plurality of first slave chips is connected to the first transmission terminal of the first master chip; and
the second transmission terminal of a second slave chip of a last stage in the plurality of second slave chips is connected to the first transmission terminal of the second master chip.

3. The memory device according to claim 2, wherein
the delay calibration chip further comprises a third transmission terminal, the third transmission terminal is started in a background mode, configured to receive the ZQ flag signal, and connected to the second transmission terminal of a primary slave chip of a last stage;
the identification module is configured to identify the priority calibration chip and the delay calibration chip before entering the background mode; and
in the background mode, the first signal receiver is configured to receive, through the ZQ signal terminal, a clock signal or a power-on signal provided by the memory, the priority calibration chip starts the calibration based on the clock signal or the power-on signal, the priority calibration chip sends the ZQ flag signal through the second transmission terminal after completing the calibration; and the primary slave chip, the delay calibration chip, and the secondary slave chip start the calibration based on the ZQ flag signal.

4. The memory device according to claim 3, wherein the priority calibration chip further comprises a fourth transmission terminal, the fourth transmission terminal is started in the background mode, configured to receive the ZQ flag signal, and connected to the second transmission terminal of a secondary slave chip of a last stage.

5. The memory device according to claim 3, wherein
the first signal receiver comprises:
a first selector, having one input terminal configured to receive the ZQ calibration command, a second input terminal configured to receive the delayed ZQ calibration command, and a selection terminal configured to receive a priority calibration identification signal or a delay calibration identification signal, and the first selector is configured to output the ZQ calibration command based on the priority calibration identification signal or output the delayed ZQ calibration command based on the delay calibration identification signal;
a first AND gate, having one input terminal connected to an output terminal of the first selector and a second input terminal configured to receive a command indication signal, wherein the command indication signal indicates that the memory operates in the command mode;
a second selector, having one input terminal configured to receive the clock signal or the power-on signal, a second input terminal configured to receive the ZQ flag signal transmitted through the third transmission terminal, and a selection terminal configured to receive the priority calibration identification signal and the delay calibration identification signal, and the second selector is configured to output the clock signal or the power-on signal based on the priority calibration identification signal or output the ZQ flag signal based on the delay calibration identification signal;
a second AND gate, having one input terminal connected to an output terminal of the second selector and a second input terminal configured to receive a background indication signal, wherein the background indication signal indicates that the memory operates in the background mode; and
a first input selector, having a first input terminal connected to an output terminal of the first AND gate, a second input terminal connected to an output terminal of the second AND gate, a first selection terminal configured to receive the command indication signal or the background indication signal, and a first output terminal configured to output a first internal calibration signal, wherein the first internal calibration signal instructs the priority calibration chip or the delay calibration chip to perform the calibration, and the first input selector is configured to connect the first input terminal to the first output terminal based on the command indication signal, or connect the second input terminal to the first output terminal based on the background indication signal; and
the second signal receiver comprises:
a third AND gate, having one input terminal configured to receive the ZQ flag signal, a second input terminal configured to receive a first indication signal, and an output terminal configured to output a second internal calibration signal, wherein the first indication signal indicates that a current chip is a first slave chip in the plurality of first slave chips or a second slave chip in the plurality of second slave chips, and the second internal calibration signal instructs the first slave chip and the second slave chip to perform the calibration.

6. The memory device according to claim 5, wherein
the first master chip and the second master chip each further comprise the second signal receiver, and each of the plurality of first slave chips and the plurality of second slave chips further comprises the first signal receiver; and
the first master chip, the plurality of first slave chips, the second master chip, and the plurality of second slave chips each further comprise:
a second input selector, having a third input terminal configured to receive the first internal calibration signal, a fourth input terminal configured to receive the second internal calibration signal, a second selection terminal configured to receive the first indication signal or a second indication signal, and a second output terminal configured to output the first internal calibration signal and the second internal calibration signal, wherein the second indication signal indicates that a current chip is the priority calibration chip or the delay calibration chip, and the second input selector is configured to connect the fourth input terminal to the second output terminal based on the first indication signal, or connect the third input terminal to the second output terminal based on the second indication signal.

7. The memory device according to claim 3, wherein
the identification module is integrated in the first master chip or the second master chip;
the identification module is configured to detect, during a first clock cycle, whether other master chip is in a ZQ calibration state;
when the other master chip is in the ZQ calibration state, the identification module sets a current master chip as the delay calibration chip and sets the other master chip as the priority calibration chip; and
when the other master chip is not in the ZQ calibration state, the identification module sets the current master chip as the priority calibration chip and sets the other master chip as the delay calibration chip.

8. The memory device according to claim 7, wherein before the current master chip is set as the priority calibration chip, the identification module is further configured to detect, during a second clock cycle, whether a level at the calibration resistor interface is higher than a first preset value;
    when the level at the calibration resistor interface is lower than the first preset value, the identification module sets the current master chip as the delay calibration chip and sets the other master chip as the priority calibration chip; and
    when the level at the calibration resistor interface is higher than the first preset value, the identification module sets the current master chip as the priority calibration chip and sets the other master chip as the delay calibration chip.

9. The memory device according to claim 8, wherein the identification module is further configured to, before the current master chip is set as the priority calibration chip, turn on a pull-down transistor in a ZQ calibration module of the current master chip during a third clock cycle and detect whether the level at the calibration resistor interface is lower than a second preset value;
    when the level at the calibration resistor interface is lower than the second preset value, the identification module sets the current master chip as the delay calibration chip and sets the other master chip as the priority calibration chip; and
    when the level at the calibration resistor interface is higher than the second preset value, the identification module sets the current master chip as the priority calibration chip and sets the other master chip as the delay calibration chip.

10. The memory device according to claim 9, wherein the identification module is further configured to, before the current master chip is set as the priority calibration chip, turn off the pull-down transistor in the ZQ calibration module of the current master chip during a fourth clock cycle and detect whether the level at the calibration resistor interface is higher than the first preset value;
    when the level at the calibration resistor interface is lower than the first preset value, the identification module sets the current master chip as the delay calibration chip and sets the other master chip as the priority calibration chip; and
    when the level at the calibration resistor interface is higher than the first preset value, the identification module sets the current master chip as the priority calibration chip and sets the other master chip as the delay calibration chip.

11. A ZQ calibration method, applied to the memory device according to claim 1, and comprising:
    identifying a priority calibration chip and a delay calibration chip in a first master chip and a second master chip, taking a first slave chip or a second slave chip cascaded with the priority calibration chip as a primary slave chip, and taking the first slave chip or the second slave chip cascaded with the delay calibration chip as a secondary slave chip;
    in a command mode, obtaining the ZQ calibration command applied outside the memory device;
    performing a first calibration on the priority calibration chip in response to the ZQ calibration command;
    after the first calibration is completed, transmitting the ZQ flag signal to a primary slave chip of a first stage, and performing a second calibration on the priority calibration chip;
    performing the first calibration on the primary slave chip of the first stage in response to the ZQ flag signal;
    after the first calibration on the primary slave chip of the first stage is completed, transmitting the ZQ flag signal to a primary slave chip of a next stage, and performing the second calibration on the primary slave chip of the first stage, until a primary slave chip of a last stage has completed the first calibration;
    completing the second calibration on the primary slave chip of the last stage;
    performing the first calibration on the delay calibration chip in response to the delayed ZQ calibration command;
    after the first calibration is completed, transmitting the ZQ flag signal to a secondary slave chip of a first stage, and performing the second calibration on the delay calibration chip;
    performing the first calibration on the secondary slave chip of the first stage in response to the ZQ flag signal;
    after the first calibration on the secondary slave chip of the first stage is completed, transmitting the ZQ flag signal to a secondary slave chip of a next stage, and performing the second calibration on the secondary slave chip of the first stage, until a secondary slave chip of a last stage has completed the first calibration; and
    completing the second calibration on the secondary slave chip of the last stage.

12. The ZQ calibration method according to claim 11, further comprising:
    identifying the priority calibration chip and the delay calibration chip in the first master chip and the second master chip, taking the first slave chip or the second slave chip cascaded with the priority calibration chip as the primary slave chip, and taking the first slave chip or the second slave chip cascaded with the delay calibration chip as the secondary slave chip;
    performing the first calibration on the priority calibration chip in response to the ZQ calibration command in a background mode;
    after the first calibration is completed, transmitting the ZQ flag signal to the primary slave chip of the first stage, and performing the second calibration on the priority calibration chip;
    performing the first calibration on the primary slave chip of the first stage in response to the ZQ flag signal;
    after the first calibration on the primary slave chip of the first stage is completed, transmitting the ZQ flag signal to the primary slave chip of the next stage, and performing the second calibration on the primary slave chip of the first stage, until a primary slave chip of a last stage completes the first calibration;
    transmitting the ZQ flag signal to the delay calibration chip, and performing the second calibration on the primary slave chip of the last stage;
    performing the first calibration on the delay calibration chip in response to the ZQ flag signal;
    after the first calibration is completed, transmitting the ZQ flag signal to the secondary slave chip of the first stage, and performing the second calibration on the delay calibration chip;
    performing the first calibration on the secondary slave chip of the first stage in response to the ZQ flag signal;
    after the first calibration on the secondary slave chip of the first stage is completed, transmitting the ZQ flag signal to the secondary slave chip of the next stage, and performing the second calibration on the secondary slave chip of the first stage, until the secondary slave chip of the last stage completes the first calibration; and completing the second calibration on the secondary slave chip of the last stage.

13. The ZQ calibration method according to claim 11, wherein before entering a background mode, the identifying the priority calibration chip and the delay calibration chip comprises: detecting, during a first clock cycle, whether the other master chip is in a ZQ calibration state;

when the other master chip is in the ZQ calibration state, setting a current master chip as the delay calibration chip, and setting the other master chip as the priority calibration chip; and when the other master chip is not in the ZQ calibration state, setting the current master chip as the priority calibration chip, and setting the other master chip as the delay calibration chip.

14. The ZQ calibration method according to claim 13, before the current master chip is set as the priority calibration chip, the ZQ calibration method further comprises: detecting, during a second clock cycle, whether a level at a calibration resistor interface is higher than a first preset value;

when the level at the calibration resistor interface is higher than the first preset value, setting the current master chip as the delay calibration chip, and setting the other master chip as the priority calibration chip; and when the level at the calibration resistor interface is lower than the first preset value, setting the current master chip as the priority calibration chip, and setting the other master chip as the delay calibration chip.

15. The ZQ calibration method according to claim 14, before the current master chip is set as the priority calibration chip, the ZQ calibration method further comprises: turning on a pull-down transistor in a ZQ calibration module of the current master chip during a third clock cycle, and detecting whether the level at the calibration resistor interface is lower than a second preset value;

when the level at the calibration resistor interface is lower than the second preset value, setting the current master chip as the delay calibration chip, and setting the other master chip as the priority calibration chip; and when the level at the calibration resistor interface is higher than the second preset value, setting the current master chip as the priority calibration chip, and setting the other master chip as the delay calibration chip.

16. The ZQ calibration method according to claim 15, before the current master chip is set as the priority calibration chip, the ZQ calibration method further comprises: turning off the pull-down transistor in the ZQ calibration module of the current master chip during a fourth clock cycle, and detecting whether the level at the calibration resistor interface is higher than the first preset value;

when the level at the calibration resistor interface is higher than the first preset value, setting the current master chip as the delay calibration chip, and setting the other master chip as the priority calibration chip; and when the level at the calibration resistor interface is lower than the first preset value, setting the current master chip as the priority calibration chip, and setting the other master chip as the delay calibration chip.

17. The ZQ calibration method according to claim 12, wherein before entering the background mode, the identifying the priority calibration chip and the delay calibration chip comprises: detecting, during a first clock cycle, whether the other master chip is in a ZQ calibration state;

when the other master chip is in the ZQ calibration state, setting a current master chip as the delay calibration chip, and setting the other master chip as the priority calibration chip; and when the other master chip is not in the ZQ calibration state, setting the current master chip as the priority calibration chip, and setting the other master chip as the delay calibration chip.

* * * * *